United States Patent [19]
Sato

[11] Patent Number: 5,994,737
[45] Date of Patent: Nov. 30, 1999

[54] SEMICONDUCTOR DEVICE WITH BIRD'S BEAK

[75] Inventor: Toshihiro Sato, Higashikurume, Japan

[73] Assignee: Citizen Watch Co, Ltd., Tokyo, Japan

[21] Appl. No.: 08/951,762

[22] Filed: Oct. 16, 1997

[51] Int. Cl.$^6$ ........................................... H01L 29/76
[52] U.S. Cl. ..................... 257/336; 257/344; 257/408
[58] Field of Search ............................ 257/408, 336, 257/344

[56] References Cited

U.S. PATENT DOCUMENTS

| | | | |
|---|---|---|---|
| 4,080,618 | 3/1978 | Tango et al. | 357/23 |
| 4,532,697 | 8/1985 | Ko | 29/571 |
| 5,113,234 | 5/1992 | Furuta et al. | 357/33.3 |
| 5,831,319 | 11/1998 | Pan | 257/408 |

*Primary Examiner*—William Mintel
*Attorney, Agent, or Firm*—Armstrong, Westerman, Hattori, McLeland & Naughton

[57] ABSTRACT

This invention provides a semiconductor device such as an MOS transistor and a method of fabricating the same wherein a field oxide film is provided to surround a device region of a semiconductor substrate (including well), providing a gate on the device region via a gate insulating film, forming main doped layers destined to become a source and a drain in the device region of the semiconductor substrate between the gate and the field oxide film on opposite sides of the gate, and providing main active layers (high-concentration diffusion layers) having the impurity diffused and activated therein. Sub-doped layers are formed by selectively adding impurity to regions of the semiconductor substrate at boundaries between the device region and the field oxide film (except in the vicinity of the gate) and sub-active layers having the impurity diffused and activated therein are provided.

2 Claims, 12 Drawing Sheets

DISTANCE BETWEEN EDGE OF DEVICE
REGION AND CONTACT HOLES (μm)

SEMICONDUCTOR DEVICE WITH BIRD'S BEAK

BACKGROUND OF THE INVENTION

1. Field of the Invention

This invention relates to a semiconductor device, particularly a MOS transistor structure whose source and drain are formed as high-concentration diffusion layers (active layers) of shallow depth, and to a method of fabricating the semiconductor device.

2. Description of the Related Art

To suppress the short-channel effect that arises with increasingly fine semiconductor device geometry, the source and drain of a MOS transistor, for example, have in recent years been formed as high-concentration diffusion layers that constitute active layers of shallow depth.

The conventional method of fabricating an N-channel MOS transistor (hereinafter called an "N-type MOS transistor") using such high-concentration diffusion layers (active layers) of shallow depth as the source and drain will be explained using the sectional views of FIGS. 25–30 and the plan view of FIG. 31.

FIGS. 25–30 are sectional views showing the conventional N-type MOS transistor fabricating method in the order of the steps. FIG. 31 is a plan view showing the surface pattern of the N-type MOS transistor. Further, FIG. 32 is a graph showing the junction breakdown voltage between the drain and well of a conventional N-type MOS transistor evaluated in terms of distance between the edge of the device region and contact holes.

The following explanation, which centers on the fabrication steps for the source and drain of the N-type MOS transistor, is presented as an explanation of the method for fabricating the structure of a conventional semiconductor device of this type.

First, as shown in FIG. 25, a P-type diffusion layer of low impurity concentration (hereinafter called a "P well") 2 is formed on a semiconductor substrate 1 and a field oxide film 3 is further formed around the device region 14.

Next, a gate insulating film 4 is formed on the surface of the device region 14. Following this, a polycrystalline silicon film 5 is formed to a prescribed thickness over the whole surface of the semiconductor substrate 1 by the chemical vapor deposition process (hereinafter called the "CVD process").

Next, as shown in FIG. 26, phosphorus, an N-type impurity, is added to the whole surface of the polycrystalline silicon film 5 by ion implantation to form a polycrystalline film 5' added with N-type impurity.

Photoresist is formed over the whole surface by spin coating, and exposure using a prescribed photomask and development are effected to pattern a photoresist 6 in the shape of a gate.

Next, the polycrystalline film 5' is etched by anisotropic etching using the patterned photoresist 6 as an etching mask to pattern a gate 7 as shown in FIG. 27. The photoresist 6 is then removed.

Using an oxidation-diffusion furnace, thermal oxidation is then effected at a temperature of 900° C. for 30 minutes in an oxygen atmosphere to form a mask oxide film 8 composed of a silicon oxide film ($SiO_2$) on the surface of the gate 7, as shown in FIG. 28.

To form a source and a drain, an impurity of N-type conductivity (such as arsenic (As)) is added to regions of the device region 14 aligned on opposite sides of the gate 7 of the semiconductor substrate 1 (regions between the gate 7 and the field oxide film 3) by ion implantation to form doped layers 9 of N-type conductivity.

Next, as shown in FIG. 29, a silicon oxide-type interlevel insulator film 10 is formed over the whole surface by the CVD process.

The impurity of the N-type doped layers 9 is then activated by effecting annealing in a nitrogen atmosphere.

This results in the formation of N-type high-concentration diffusion layers 11, 11 constituting the source and drain of the N-type MOS transistor.

The interlevel insulator film 10 is then patterned by effecting anisotropic etching of prescribed portions to form contact holes 12, 12, as shown in FIG. 30.

Interconnecting electrodes 13, 13 composed of aluminum are then formed through the contact holes 12, 12 to contact the high-concentration diffusion layers 11, 11 constituting the source (S) and the drain (D), thereby completing an N-type MOS transistor. A contact hole 12 and an interconnecting electrode 13 are also formed with respect to the gate 7 (G) at a location that does not appear in the sectional view of FIG. 30.

The plan view of FIG. 31 shows the surface pattern of the N-type MOS transistor having the high-concentration diffusion layers 11 that was fabricated by the conventional fabrication method explained with reference to FIGS. 25–30. The mask oxide film 8, interlevel insulator film 10, high-concentration diffusion layers 11 and the interconnecting electrodes 13 shown in FIG. 30 are omitted from the plan view of FIG. 31.

FIGS. 30 and 31 show the structure of a conventional N-type MOS transistor having high-concentration diffusion layers 11 of shallow depth as its source and drain.

The solid line in FIG. 31 indicates the inner edge portion 3b of the field oxide film 3 and the rectangle defined by the phantom line outward thereof indicates the outer peripheral portion of the device region 14.

The value of distance X in FIG. 31 is that between the edge portion of the device region 14 and the contact holes 12 and serves as a reference when evaluating the junction breakdown voltage between the drain and well of the N-type MOS transistor.

The variation in the junction breakdown voltage between the drain and well of the N-type MOS transistor with distance between the edge portion of the device region 14 and the contact holes 12 is shown by the graph of FIG. 32.

The horizontal axis of the graph of FIG. 32 represents the distance ($\mu$m) between the edge portion of the device region and the contact holes in the N-type MOS transistor, i.e., values corresponding to the distance X shown in FIG. 31, and the vertical axis represents the junction breakdown voltage (V) between the drain and well.

As is clear from this figure, the junction breakdown voltage between the drain and well of the N-type MOS transistor formed by the prior art method described above is strongly dependent on the distance between the edge portion of the device region and the contact holes.

This is because, as shown in FIG. 29, in the N-type MOS transistor whose source and drain are formed as high-concentration diffusion layers 11 of shallow depth by the prior art fabrication method, impurity cannot be implanted in the portion under the bird's beak 3a of thin oxide film at the peripheral portion of the field oxide film 3, so that the high-concentration diffusion layers 11 to become the source and drain cannot be formed here.

Therefore, if the distance X shown in FIG. 31 becomes small owing to formation of the contact holes 12 out of alignment with the prescribed locations within the device region 14, the contact holes 12 will have portions formed as far as the bird's beak 3a of the field oxide film 3 and the interconnecting electrodes 13 shown in FIG. 30 formed in the contact holes 12 will directly contact the P well 2 or the semiconductor substrate 1 without any intervening doped layer.

As a result, unnecessary current will flow within the semiconductor substrate 1 including the P well 2, making it difficult to control normal operation of the N-type MOS transistor.

SUMMARY OF THE INVENTION

The object of this invention is to overcome this problem in a semiconductor device such as an MOS transistor having a source and a drain formed as high-concentration diffusion layers (active layers) of shallow depth by providing a semiconductor device which can maintain the junction breakdown voltage between the drain and the semiconductor substrate (including the well) at an adequate value independently of the distance between the edge portion of the device region and the contact holes, and a method of fabricating the same.

For achieving this object, the semiconductor device according to the invention comprises a field oxide film provided to surround a device region provided in a semiconductor substrate, a gate provided in the device region via an intervening gate insulating film, impurity-diffused main active layers provided in regions of the semiconductor substrate between the gate and the field oxide film, and sub-active layers provided by selectively diffusing impurity into regions of the semiconductor substrate at boundaries between the device region and the field oxide film.

The "semiconductor substrate" is defined to include what is obtained by forming a well and providing a device region in the well, as described earlier.

A mask oxide film is preferably formed on the surface of the gate.

In the semiconductor device according to the invention, by thus providing the impurity-diffused sub-active layers (of the same conductivity type as the main active layers) in regions of the semiconductor substrate at the boundaries between the device region and the field oxide film, the interconnecting electrodes can be prevented from directly contacting the semiconductor substrate (well) even if the distance between the edge portion of the device region and the contact holes becomes small. By this there can be obtained a semiconductor device which has as a characteristic that the junction breakdown voltage between the drain and the semiconductor substrate (well) exhibits no dependence on the distance between the edge portion of the device region and the contact holes.

Even if the geometry of semiconductor device is made finer, no difference in characteristics arises between one device and another and the transistor operation can be controlled with high accuracy.

The fabrication method according to the invention for fabricating such a semiconductor device comprises:
  a step of forming a field oxide film to surround a device region of a semiconductor substrate,
  a step of forming a gate insulating film on a surface of the semiconductor substrate within the device region,
  a step of forming a gate on the gate insulating film,
  a step of forming main doped layers by adding to regions of the semiconductor substrate between the gate and the field oxide film impurity for forming a source and a drain,
  a step of forming sub-doped layers by selectively adding impurity to regions of the semiconductor substrate at boundaries between the device region and the field oxide film, and
  a step of forming main active layers constituting the source and the drain and forming sub-active layers by, after forming the whole surface of the semiconductor substrate with an insulating film, effecting annealing to activate the main doped layers and activate the sub-doped layers.

A step of forming a mask oxide film on a surface of the gate can be effected between the step of forming the gate and the step of forming the main doped layers.

In the step of forming the main active layers and the sub-active layers, short-period annealing using a lamp annealer is preferably effected.

Further, in the step of forming the sub-doped layers, impurity can be selectively added to the semiconductor substrate by penetration through the field oxide film at a peripheral portion of the device region.

The invention also provides other fabrication methods in which some steps are modified from those of the foregoing fabrication method, which will be described in detail in the explanation of embodiments.

The above and other objects, features and advantages of the invention will be apparent from the following detailed description which is to be read in conjunction with the accompanying drawings.

DETAILED DESCRIPTION OF THE PREFERRED EMBODIMENTS

Preferred embodiments of the invention will now be explained with reference to the drawings. Although the following explanation of embodiments will be made with respect to an N-type MOS transistor as the semiconductor device to which the invention is applied, the invention can also be similarly implemented with respect to a P-type MOS transistor if the impurity is changed.

A first embodiment of the invention will be explained with reference to FIGS. 1–14. In these figures, portions corresponding to those of the prior art example shown in FIGS. 25–31 are assigned like reference symbols to those in FIGS. 25–31.

The structure of the N-type MOS transistor that is the first embodiment of the semiconductor device according to the invention will first be explained using the sectional view of FIG. 12 and the plan view of FIG. 13.

Figure 12:
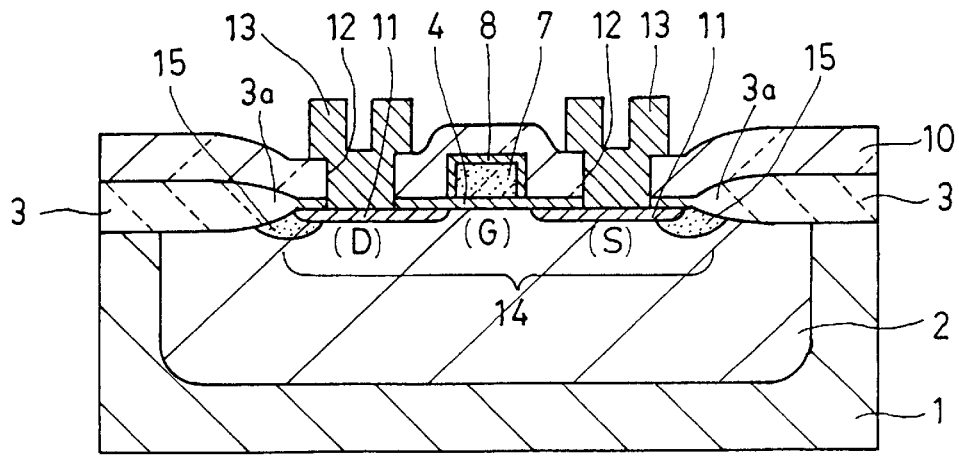
Figure 13:
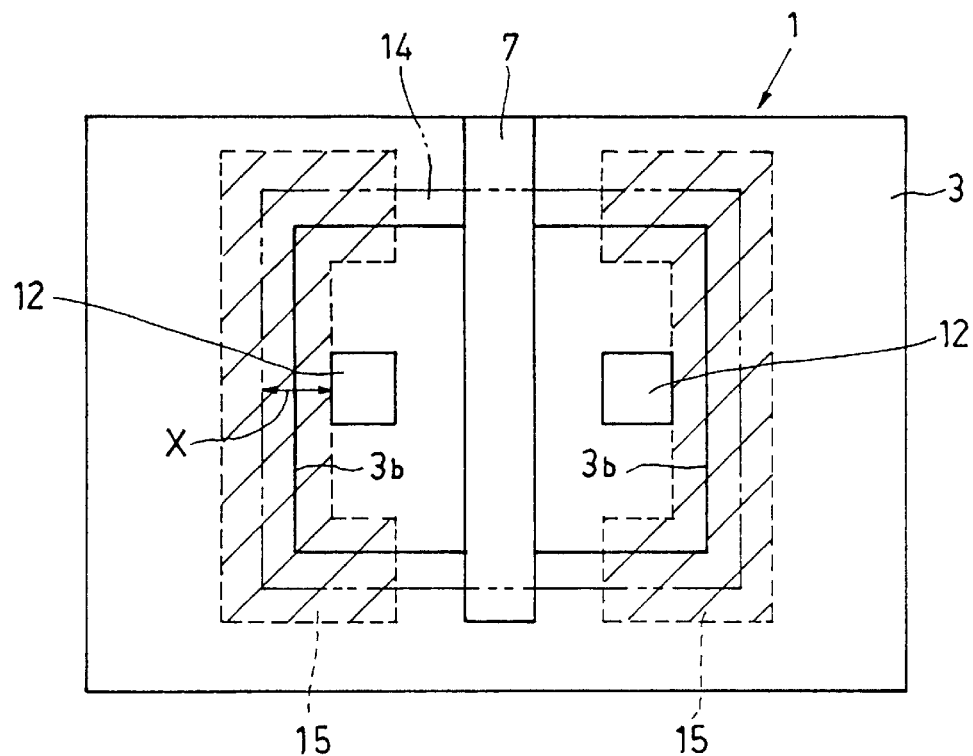
FIG. 13 is a plan view of the semiconductor device shown in FIG. 12, with some portions omitted.

As shown in FIGS. 12 and 13, this N-type MOS transistor is comprising that a P well 2 is provided in a semiconductor substrate 1 and a device region 14 is provided in the P well 2. A field oxide film 3 is further provided around the device region 14.

A gate 7 is provided in the device region 14 via an intervening gate insulating film 4 and high-concentration diffusion layers 11 of N-type conductivity are provided as main active layers in the region between the gate 7 and the field oxide film 3 (aligned on opposite sides of the gate 7). The high-concentration diffusion layers 11 constitute the source (S) and the drain (D) of the MOS transistor. A mask oxide film 8 is formed on the surface of the gate 7 (G).

Figure 30:
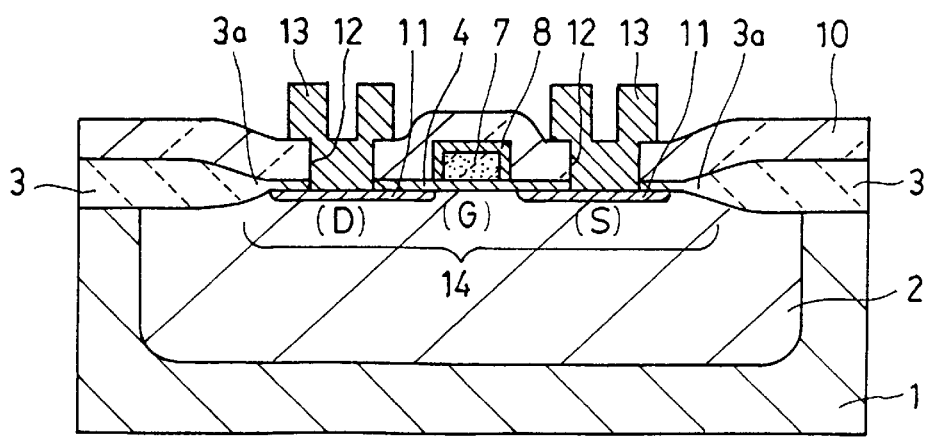
Figure 31:
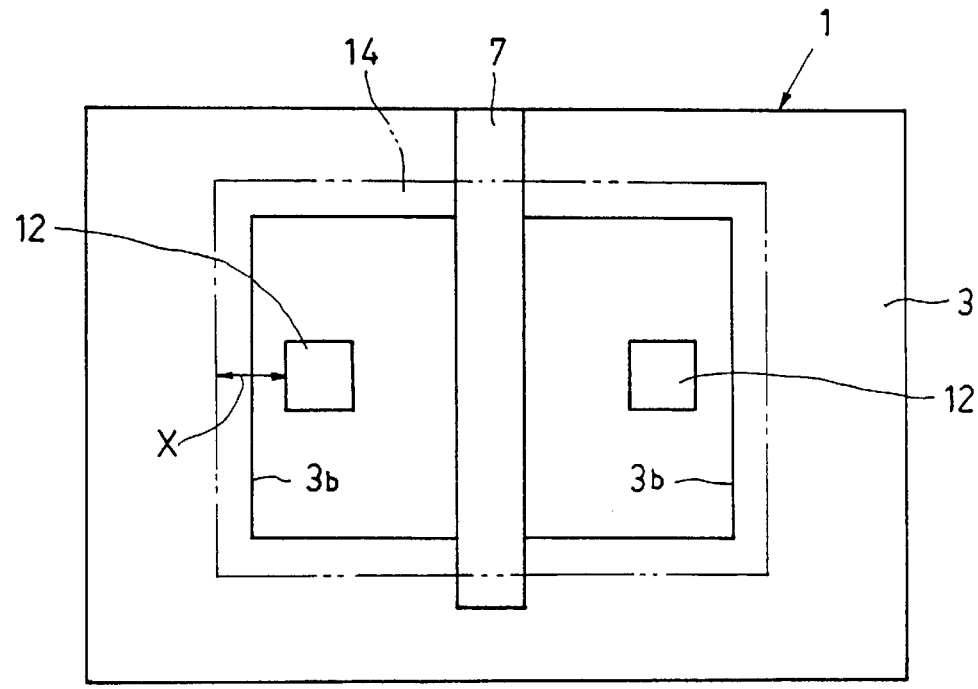
FIG. 31 is a plan view of the semiconductor device shown in FIG. 30, with some portions omitted.
Figure 32:
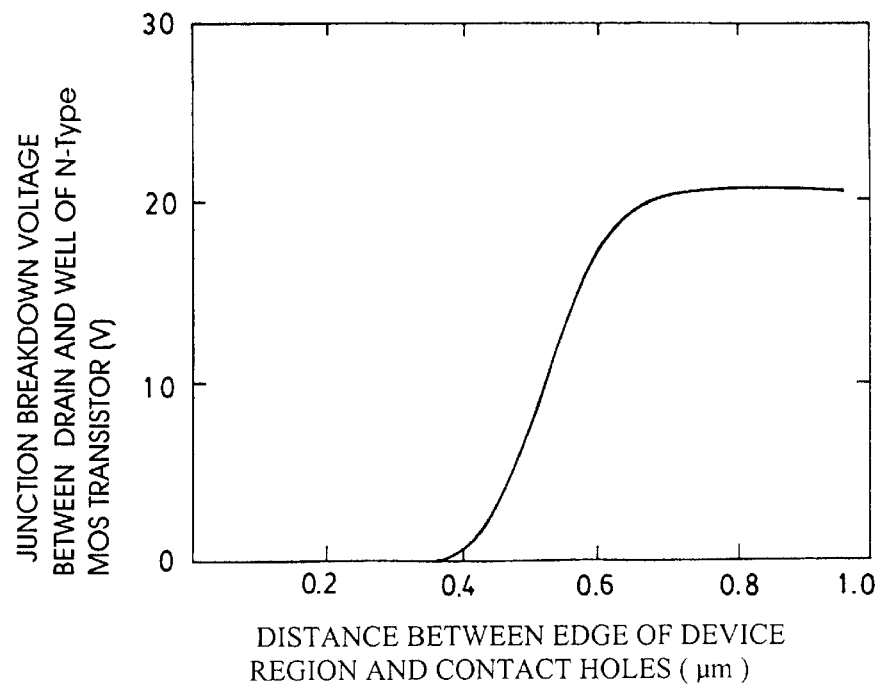
FIG. 32 is a graph showing the junction breakdown voltage between the drain and well of a N-type which is a conventional semiconductor device evaluated in terms of distance between the edge of the device region and contact holes.

These structural elements are the same as those of the prior art N-type MOS transistor shown in FIGS. 30 and 31.

Where this embodiment differs from the prior art device is that it is provided in regions of the P well 2 of the semiconductor substrate 1 between the device region 14 and the field oxide film 3 with, as sub-active layers, boundary region diffused layers 15, 15 diffused with impurity of N-type conductivity. The planar pattern of these boundary region diffusion layers 15 corresponds to the hatched regions indicated by broken lines in the plan view of FIG. 13. These sub-active layers are not formed in the vicinity of the gate 7, which is a non-formed region.

As in the prior art examples shown in FIGS. 30 and 31, an interlevel insulator film 10 is formed over the whole surface, contact holes 12, 12 are provided in the interlevel insulator film 10, and interconnecting electrodes 13, 13 are formed through the contact holes 12, 12 to contact the N-type high-concentration diffusion layers 11, 11 constituting the source and drain.

Thus, in this N-type MOS transistor, the boundary region diffusion layers 15 diffused with impurity of N-type conductivity are provided as sub-active layers in the regions of the P well 2 of the semiconductor substrate 1 between the device region 14 and the field oxide film 3 other than those in the vicinity of the gate 7.

Since the boundary region diffusion layers 15 are high-concentration impurity regions and are of the same conductivity type as the high-concentration diffusion layers 11 constituting the source and drain, impurity can also be added to the regions under the bird's beak of thin oxide film at the peripheral portion of the field oxide film 3 to enable provision of the boundary region diffusion layers 15 with high impurity concentration.

Therefore, even if the distance X between the inner periphery of the device region 14 and the contact holes 12 shown in FIG. 13 becomes small owing to formation of the contact holes 12 out of alignment with the prescribed locations within the device region 14, the interconnecting electrodes 13, 13 formed in the contact holes 12 to contact the high-concentration diffusion layers 11, 11 constituting the source and drain will not directly contact the P well 2 through the bird's beak of thin oxide film at the peripheral portion of the field oxide film 3 but will contact the boundary region diffusion layers 15 constituting the sub-active layers. Therefore, since no unnecessary current flows within the semiconductor substrate 1, normal operation of the MOS transistor can be controlled at all times.

Figure 14:
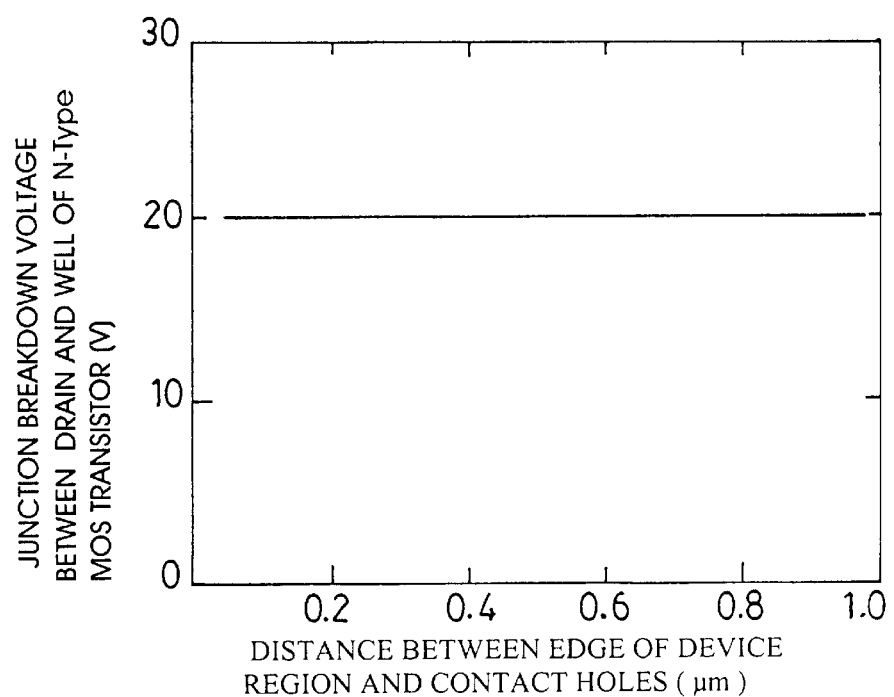
FIG. 14 is a graph showing the junction breakdown voltage between the drain and well of an N-type MOS transistor which is a semiconductor device according to the invention evaluated in terms of distance between the edge of the device region and contact holes.

The graph of FIG. 14 shows the variation in the junction breakdown voltage between the drain and well of the N-type MOS transistor of this embodiment with distance between the edge portion of the device region 14 and the contact holes 12.

The horizontal axis of the graph of FIG. 14 represents the distance between the edge portion of the device region 14 and the contact holes 12 of the N-type MOS transistor, i.e., corresponds to the distance X of FIG. 13, and the vertical axis represents the junction breakdown voltage between the drain and well (semiconductor substrate) of the N-type MOS transistor.

As can be seen from this figure, in the N-type MOS transistor according to this embodiment of the invention, the dependence of the junction breakdown voltage between the drain and the well (semiconductor substrate) on distance between the edge portion of the device region and the contact holes, which is a problem in the conventional N-type MOS transistor, does not arise and a breakdown voltage of 20 V is always secured.

The invention thus greatly mitigates the dependence of the junction breakdown voltage between the drain and the well (semiconductor substrate) in an MOS transistor on the distance between the edge portion of the device region and the contact holes.

An embodiment of a method of fabricating the N-type MOS transistor that is the semiconductor device of this embodiment will next be explained with reference to the sectional views of the steps shown in FIG. 1 to FIG. 12 and the plan view of FIG. 13.

Figure 1:
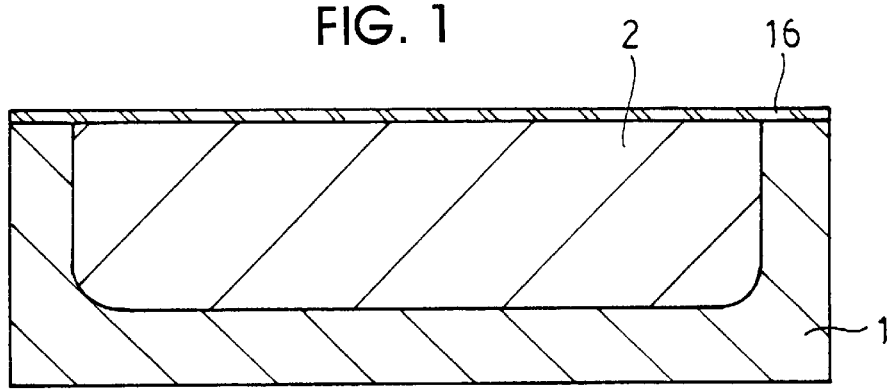
FIGS. 1–12 are sectional views showing the steps of a first embodiment of the method of fabricating a semiconductor device according to the invention, with FIG. 12 showing the structure of a completed first embodiment of the semiconductor device.

First, boron (B), a P-type impurity, is selectively added to the region of the semiconductor substrate 1 shown in FIG. 1 to be formed with the P well 2, by ion implantation under condition of an ion implantation dose of about $10^{13}$ atoms/$cm^2$.

The P well 2 is then formed by effecting thermal annealing at a temperature of 1140° C. in a nitrogen atmosphere to diffuse the implanted boron in the semiconductor substrate 1.

Oxidation is further effected at a temperature of 1000° C. in an oxygen atmosphere to form a 30-nm pad oxide film 16 composed of $SiO_2$ on the surface of the semiconductor substrate 1.

Figure 2:
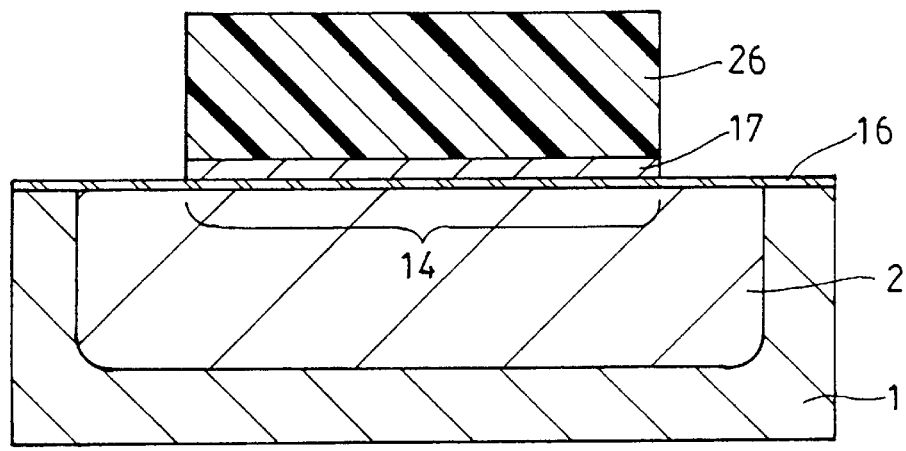

Next, the 150-nm silicon nitride film 17 shown in FIG. 2 is formed on the pad oxide film 16 by the CVD process using dichlorosilane ($SiH_2Cl_2$) and ammonia ($NH_3$) as the reaction gas.

The whole surface of the silicon nitride film 17 is then coated with photoresist by spin coating and the photoresist 26 is exposed through a prescribed photomask and developed to pattern it to remain only on the device region 14, as shown in FIG. 2.

Following this, the silicon nitride film 17 is patterned to remain only on the device region 14 by dry etching using trifluoromethane ($CHF_3$), sulfur hexafluoride ($SF_6$) and helium (He) as reaction gas and employing the patterned photoresist 26 as an etching mask.

Figure 3:
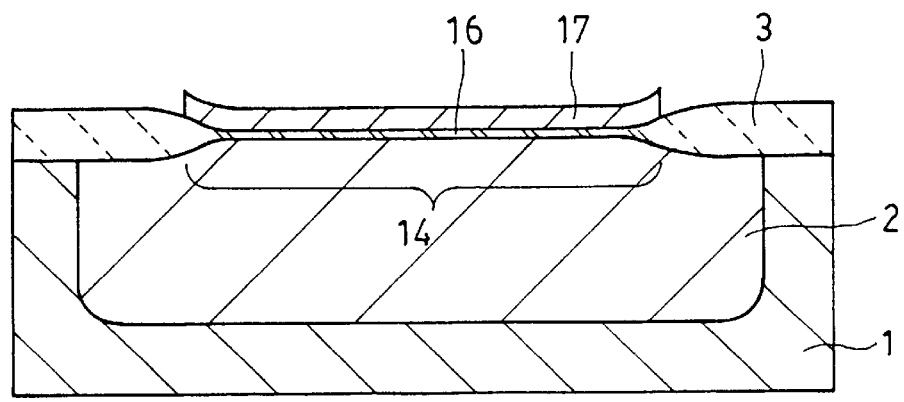

The photoresist 26 used as the etching mask is thereafter removed. Then, as shown in FIG. 3, a field oxide film 3 is formed to a thickness of 550 nm by selective oxidation at a temperature of 1000° C. in an oxygen atmosphere using the silicon nitride film 17 as an oxidation-resistant film. The field oxide film 3 resulting from this selective oxidation is formed to surround the device region 14.

Figure 4:
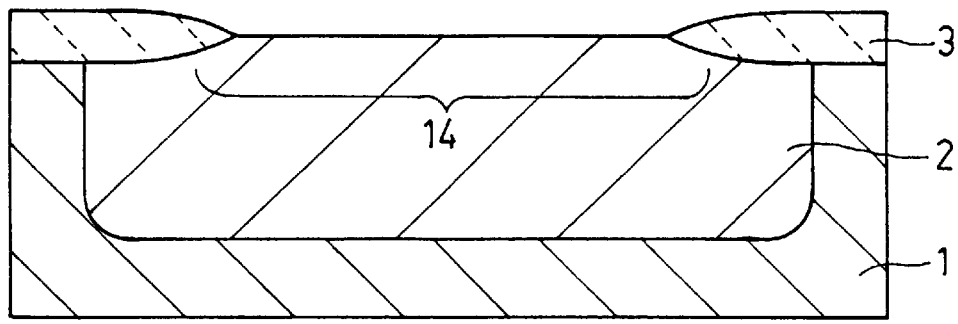

Next, as shown in FIG. 4, the silicon nitride film 17 is removed with hot phosphoric acid ($H_3PO_4$) heated to a temperature of 160° C. and the pad oxide film 16 under the silicon nitride film 17 is removed with a buffered hydrofluoric acid ($NH_4F+HF$) solution.

Figure 5:
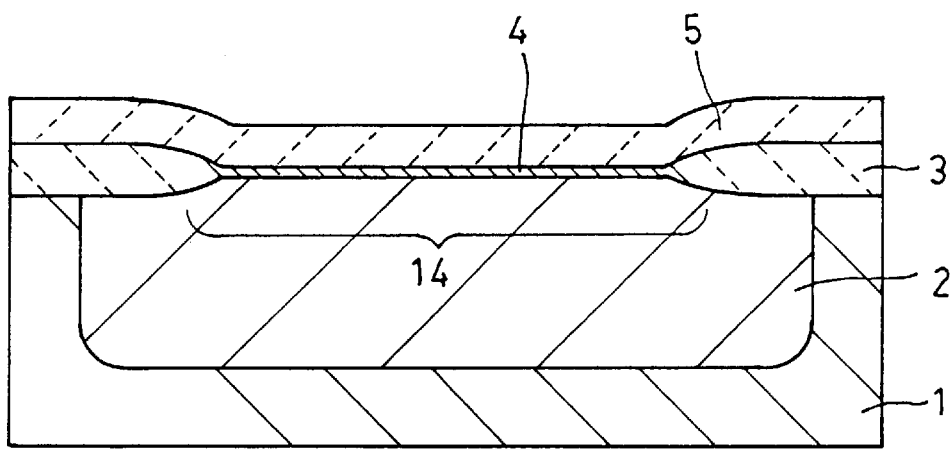

The semiconductor substrate 1 having the field oxide film 3 formed in the region surrounding the device region 14 in this way is subjected to thermal oxidation at a temperature of 1000° C. As shown in FIG. 5, this thermal oxidation forms a gate insulating film 4 of $SiO_2$ on the surface of the device region 14 to a thickness of 20 nm.

Following this, as shown in FIG. 5, a polycrystalline silicon film 5 is formed to a thickness of 350 nm over the whole surfaces of the field oxide film 3 and the gate insulating film 4 on the semiconductor substrate 1 by the CVD process using monosilane ($SiH_4$) as reaction gas.

Figure 6:
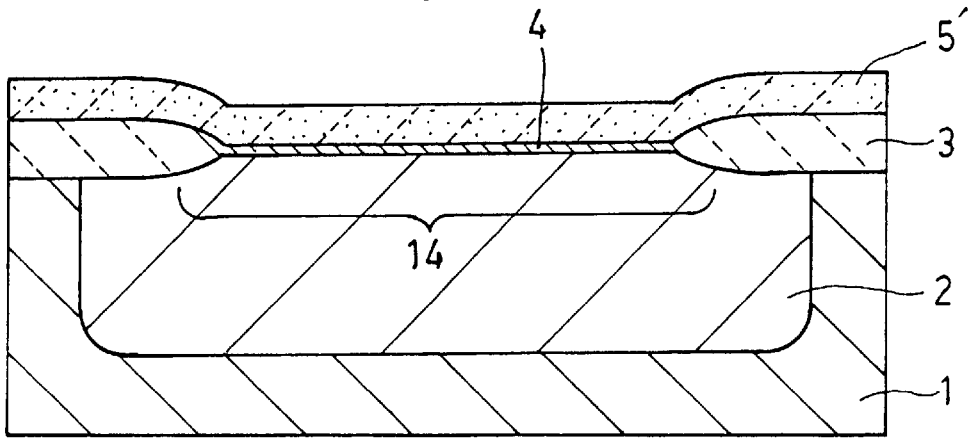

Next, phosphorus (P), an impurity of N-type conductivity, is added over the whole surface of the polycrystalline silicon film 5 by ion implantation under condition of an ion implantation dose of about $10^{16}$ atoms/$cm^2$, whereby, as shown in FIG. 6, a polycrystalline film 5' added with N-type impurity is formed at the region to be formed with the N-type MOS transistor.

Figure 7:
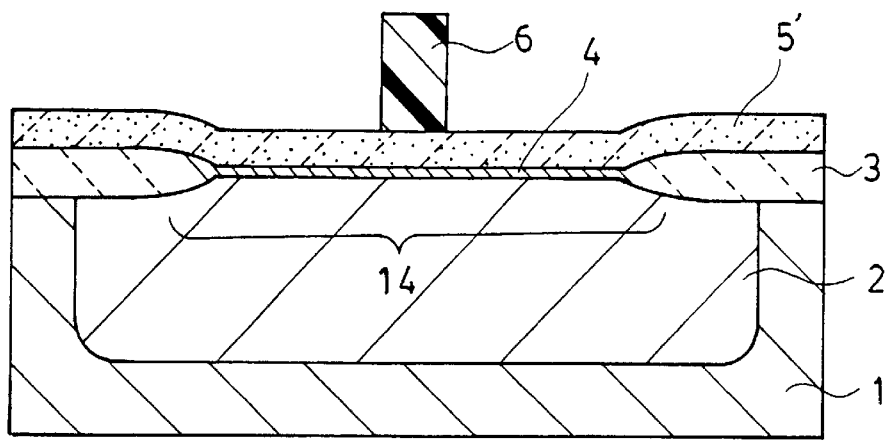

Following this, the whole surface of the polycrystalline film 5' is coated with photoresist by spin coating and the photoresist 6 is exposed through a prescribed photomask and developed to pattern it in the shape of a gate, as shown in FIG. 7.

Figure 8:
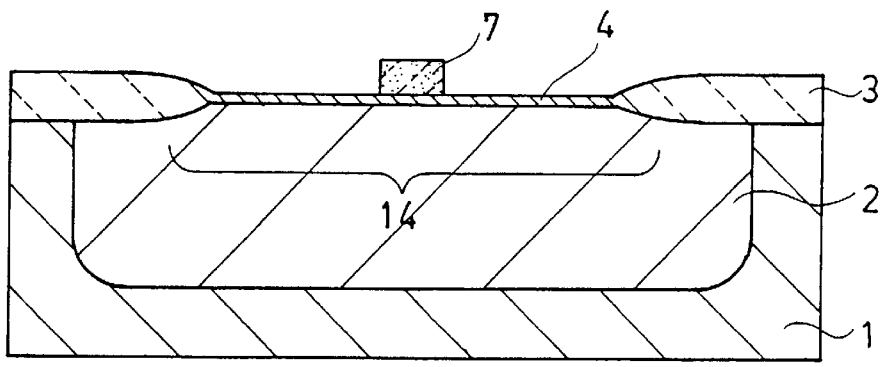

The patterned photoresist 6 is then used as an etching mask to etch the polycrystalline film 5' by anisotropic etching using sulfur hexafluoride ($SF_6$), chlorine ($Cl_2$) and difluoromethane ($CH_2F_2$) as etching gas to pattern it as a gate 7, as shown in FIG. 8.

Following this, the photoresist 6 used as the etching mask is removed from the gate 7.

Figure 9:
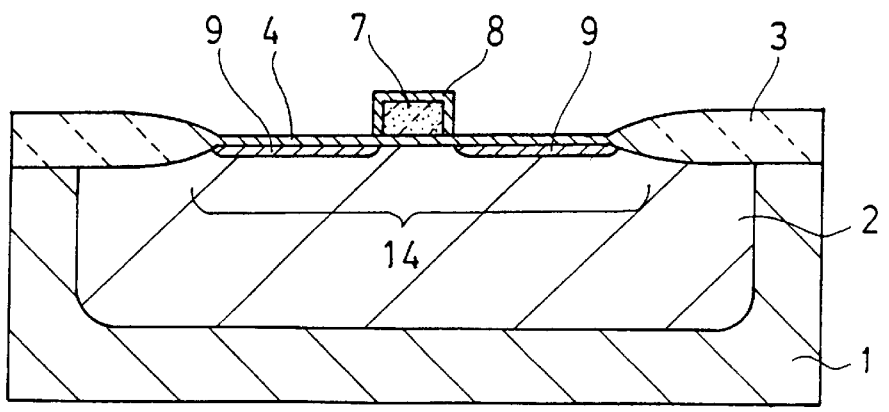

Next, thermal oxidation is effected at a temperature of 900° C. in an oxygen atmosphere using an oxidation-diffusion furnace. As shown in FIG. 9, this results in the formation of a 10-nm mask oxide film 8 on the surface of the gate 7.

Following this, to form the source and drain, the regions of the P well 2 of the semiconductor substrate 1 between the gate 7 and the field oxide film 3 (the regions on opposite sides of the gate 7) are added with arsenic (As), an impurity of N-type conductivity, by ion implantation under conditions of an ion injection acceleration energy of 60 KeV and an ion implantation dose of about $10^{15}$ atoms/$cm^2$. As shown in FIG. 9, this forms main doped layers 9, 9.

Figure 10:
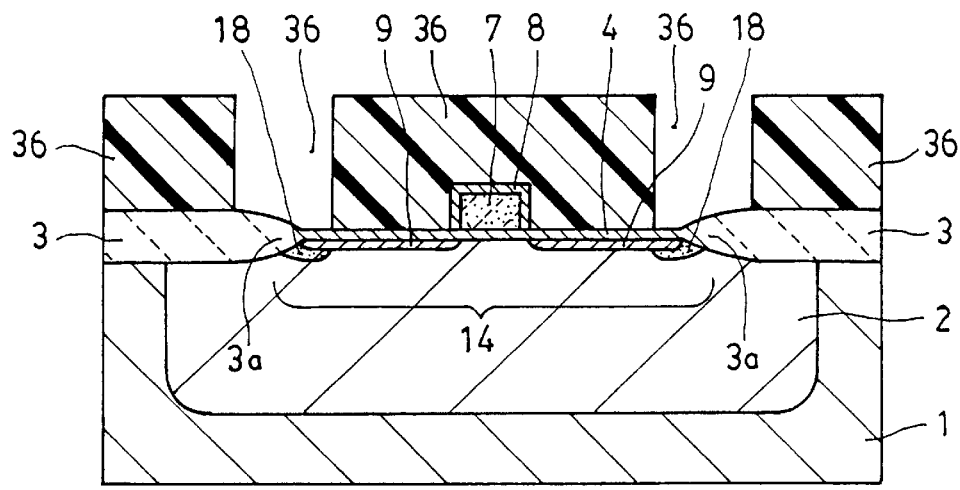

The whole surfaces of the field oxide film 3, the gate insulating film 4 and the mask oxide film 8 are coated with photoresist 36 by spin coating and the photoresist 36 is exposed through a prescribed photomask and developed to pattern it to have openings at regions to be formed with boundary region diffusion layers constituting sub-active layers of the N-type MOS transistor, as shown in FIG. 10.

By this, the photoresist 36, which serves as a blocking film during ion implantation, is formed with open portions 36a at the boundary regions between the device region 14 and the field oxide film 3 other than the regions in the vicinity of the gate 7. Specifically, the hatched region in FIG. 13 corresponds to open portions 36a of the photoresist 36. In FIG. 13, the solid line indicates the inner edge portion 3b of the field oxide film 3 and the rectangle defined by the phantom line outward thereof indicates the outer peripheral portion of the device region 14.

Using the photoresist 36 as a blocking film during ion implantation, the regions of the P well 2 between the device region 14 and the field oxide film 3 are added with phosphorus (P), an impurity of N-type conductivity, by ion implantation under conditions of an ion injection acceleration energy of 50 KeV and an ion implantation dose of about $10^{15}$ atoms/$cm^2$, thereby forming sub-doped layers 18, 18.

At this time, phosphorus ions are selectively implanted in the regions of the P well 2 between the field oxide film 3 and the device region 14 to form the sub-doped layers 18, 18. The photoresist 36 used as the blocking film during ion implantation is then removed.

Figure 11:
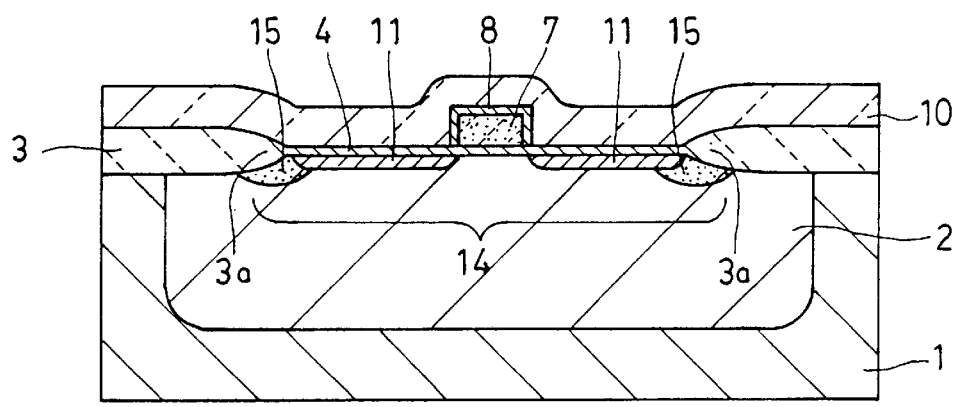

Next, as shown in FIG. 11, an interlevel insulator film 10 consisting of a silicon oxide film containing boron (B) and phosphorus (P) is formed to a thickness of 500 nm over the whole surface by the CVD process using monosilane ($SiH_4$), diborane ($B_2H_6$) and phosphine ($PH_3$) as reaction gas.

Following this, thermal annealing is effected at a temperature of 900° C. in a nitrogen atmosphere using an oxidation-diffusion furnace. This thermal annealing simultaneously activates the N-type impurity arsenic of the main doped layers 9, 9 and the N-type impurity phosphorus of the sub-doped layers 18, 18 formed as shown in FIG. 10.

As a result, as shown in FIG. 11, high-concentration diffusion layers 11, 11, which are main active layers of N-type conductivity constituting the source and drain of the N-type MOS transistor, and boundary region diffused layers 15, 15, which are sub-active layers of N-type conductivity, are simultaneously formed.

At this time, since the phosphorus of the sub-doped layers 18 has a higher diffusion coefficient than the arsenic of the doped layers 9, the boundary region diffusion layers 15 constituting the sub-active layers diffuse more than the high-concentration diffusion layers 11 constituting the main active layers so as to wrap far under the bird's beak 3a.

Following this, the contact holes 12, 12 shown in FIG. 12 are formed by patterning prescribed locations of the interlevel insulator film 10 by anisotropic etching using difluoromethane ($CH_2F_2$) and trifluoromethane ($CHF_3$) as reaction gas and photoresist (not shown) as an etching mask.

An interconnecting material composed of aluminum alloy is then formed over the whole surface of the interlevel insulator film 10 by sputtering, whereafter etching is effected using photoresist patterned in the shape of interconnecting electrodes as an etching mask to form interconnecting electrodes 13, 13 that contact the high-concentration diffusion layers 11 constituting the source (S) and the drain (D), thereby completing the N-type MOS transistor.

Next, an embodiment will be explained in which the steps for forming the boundary region diffusion layers 15 constituting the sub-active layers are partially modified from that in the foregoing first embodiment explained with reference to FIGS. 10 and 11.

As shown in FIG. 10, in the embodiment explained above, the photoresist 36 is patterned to form the openings 36a at the boundary regions between the device region 14 and the field oxide film 3, other than the regions in the vicinity of the gate 7, where the boundary region diffusion layers 15 shown in FIG. 13 are to be formed, whereafter phosphorus (P) is injected into the regions of the P well 2 within the openings 36a of the photoresist 36 as impurity of N-type conductivity to form the sub-doped layers 18.

The sub-doped layers 18 can also be formed by injecting arsenic (As) instead of phosphorus (P) as the impurity of N-type conductivity.

In this case, the arsenic is added to the regions of the P well 2 within the openings 36a of the photoresist 36 by ion implantation under conditions of an ion injection acceleration energy of 120 KeV, which enables the arsenic to penetrate through the field oxide film 3 at the edge of the device region 14, and an ion implantation dose of about $10^{15}$ atoms /cm$^2$. At this time, the arsenic atoms penetrate through the thin bird's beak 3a at the boundary region between the field oxide film 3 and the device region 14 to be implanted in the P well 2 and form the sub-doped layers 18. Following this, the photoresist 36 used as the blocking film is removed.

Then, as in the first embodiment, the interlevel insulator film 10 shown in FIG. 11 is formed over the whole surface to a thickness of 500 nm by the CVD process and annealing is effected at a temperature of 900° C. in a nitrogen atmosphere using an oxidation-diffusion furnace. This thermal annealing simultaneously activates the N-type impurity arsenic of the main doped layers 9 and sub-doped layers 18, 18.

As a result, as shown in FIG. 11, high-concentration diffusion layers 11, 11, which are main active layers of N-type conductivity constituting the source and drain of the N-type MOS transistor, and boundary region diffused layers 15, 15, which are sub-active layers of N-type conductivity, are simultaneously formed.

The N-type MOS transistor is thereafter completed by the same steps as in the case of the foregoing first embodiment.

With this N-type MOS transistor, too, there can be obtained a characteristic like that shown by the graph of FIG. 14, namely, that the junction breakdown voltage between the drain and the well exhibits no dependence on the distance between the edge portion of the device region and the contact holes.

In the first embodiment explained in the foregoing (including the foregoing embodiment having some steps modified), the series of steps including the forming and patterning of the photoresist and the etching effected using the patterned photoresist, which constitute photoetching, are effected after patterning of the gate 7 to effect oxidization at 900° C. in an oxygen atmosphere and form the mask oxide film 8 on surface of the gate 7.

However, a similar effect can be obtained even if the step of forming the mask oxide film 8 is omitted and no mask oxide film 8 is formed on the surface of the gate 7.

Moreover, the N-type high-concentration diffusion layers 11, which are main active layers constituting the source and the drain, and the boundary region diffusion layers 15, which are sub-active layers, were explained, by way of example, to be formed by annealing in a nitrogen atmosphere using an oxidation-diffusion furnace.

However, a similar effect can be obtained even if the main active layers of N-type conductivity constituting the source and drain (the high-concentration diffusion layers 11) and the sub-active layers provided at the boundary regions between the device region and the field oxide film (the boundary region diffusion layers 15) are formed by short-period annealing using a lamp annealer in place of the oxidation-diffusion furnace.

Next, second embodiments of the semiconductor device structure and fabrication method according to the invention will be explained.

Figure 22:
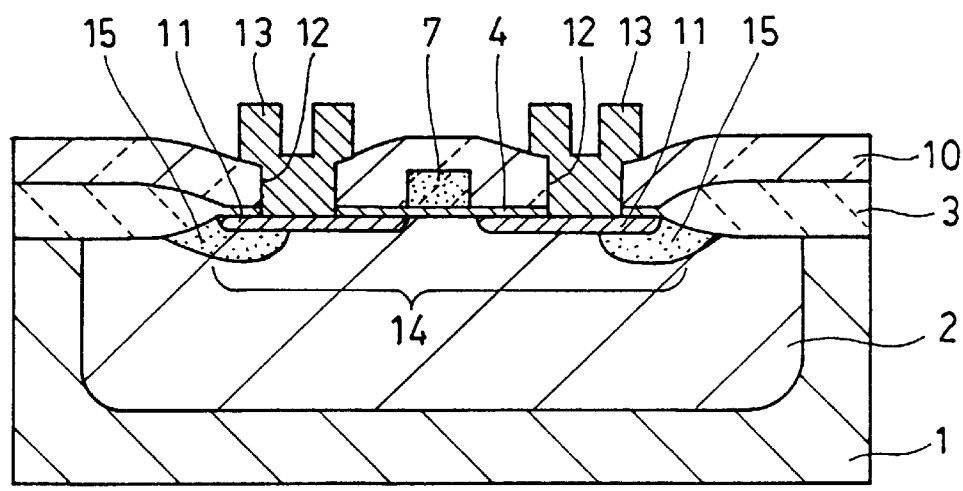

As shown in the sectional view of FIG. 22, the N-type MOS transistor that is the semiconductor device of the second embodiment is of substantially the same structure as the N-type MOS transistor of the first embodiment but the surface of the gate is not formed with the mask oxide film 8 shown in FIG. 12. The surface pattern of this N-type MOS transistor is not illustrated because it is the same as that in the case of the first embodiment shown in FIG. 13.

Next, the method of fabricating the N-type MOS transistor that is the semiconductor device of the second embodiment will be explained with reference to FIGS. 15–22. Since up to the formation of the field oxide film on the semiconductor substrate 1 it is the same as in the case of the foregoing first embodiment, however, these steps will be explained briefly again referring to FIGS. 1–3.

Specifically, as shown in FIG. 1, boron is implanted in the semiconductor substrate 1 and the P well 2 is then formed by effecting thermal annealing to diffuse the implanted boron in the semiconductor substrate 1. Oxidation is further effected at a temperature of 1000° C. in an oxygen atmosphere to form the pad oxide film 16 on the surface of the semiconductor substrate 1.

Next, the silicon nitride film 17 shown in FIG. 2 is formed on the pad oxide film 16 by the CVD process using dichlorosilane ($SiH_2Cl_2$) and ammonia ($NH_3$) as the reaction gas.

The whole surface of the silicon nitride film 17 is then coated with photoresist 26, which is patterned to remain only on the device region 14, as shown in FIG. 2. The silicon nitride film 17 is patterned to remain only on the device region 14 by dry etching using the photoresist 26 as an etching mask.

Following this, the photoresist 26 is removed and, as shown in FIG. 3, a field oxide film 3 is formed to a thickness of 550 nm by selective oxidation at a temperature of 1000° C. in an oxygen atmosphere using the silicon nitride film 17 as an oxidation-resistant film. The field oxide film 3 resulting from this selective oxidation is formed to surround the device region 14.

The silicon nitride film 17 is then removed with hot phosphoric acid ($H_3PO_4$) heated to a temperature of 160° C. but, in this embodiment, the pad oxide film 16 is allowed to remain on the device region 14.

The steps of this embodiment shown in FIGS. 15–22 are then effected. The portions in these figures corresponding to those in FIGS. 1–12 are assigned the same reference symbols as those in FIGS. 1–12.

Figure 15:
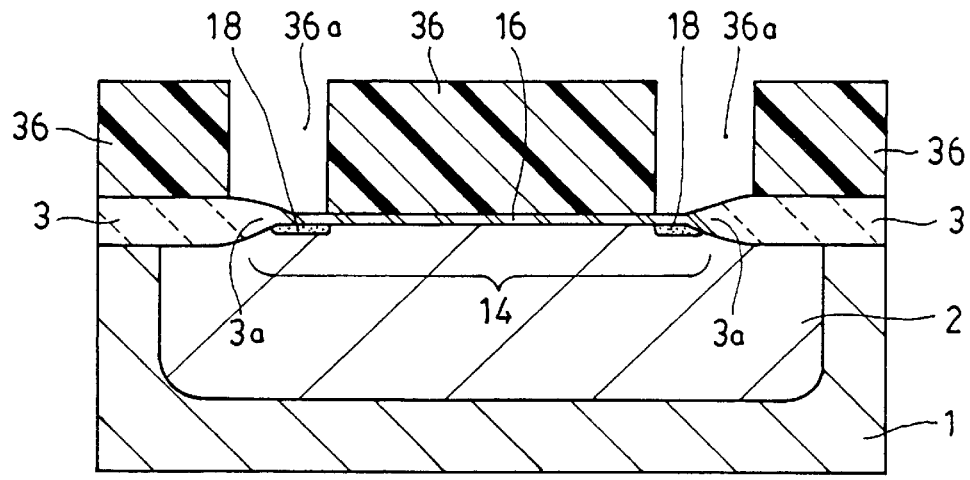
FIGS. 15–22 are sectional views showing the steps after field oxide film formation in a second embodiment of the method of fabricating a semiconductor device according to the invention, with FIG. 22 showing the structure of a completed second embodiment of the semiconductor device.

In the step shown in FIG. 15, the whole surfaces of the field oxide film 3 and the pad oxide film 16 are coated with photoresist by spin coating and the photoresist 36 is exposed through a prescribed photomask and developed to pattern it to form the openings 36a coinciding with regions of the N-type MOS transistor to be formed with the boundary region diffusion layers.

Using the photoresist 36 as a blocking film during ion implantation, the regions of the P well 2 in the vicinity of the bird's beak 3a of the field oxide film 3 are added with arsenic, an impurity of N-type conductivity, by ion implantation under conditions of an ion injection acceleration energy of 60 KeV and an ion implantation dose of about $10^{15}$ atoms /cm$^2$, thereby forming the sub-doped layers 18, 18.

Following this, the photoresist 36 is removed. Further, the pad oxide film 16 is removed with a buffered acid solution ($NH_4F+HF$).

Figure 16:
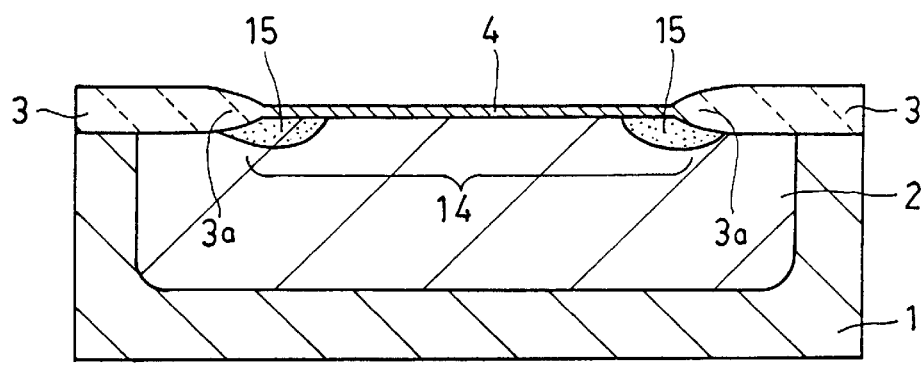

Next, as shown in FIG. 16, the semiconductor substrate 1 having the field oxide film 3 formed in the region surrounding the device region 14 is subjected to thermal oxidation at a temperature of 1000° C. This thermal oxidation forms a gate insulating film 4 of $SiO_2$ on the surface of the device region 14 to a thickness of 20 nm and simultaneously activates and diffuses the N-type impurity arsenic of the sub-doped layers 18 to form the boundary region diffused layers 15, 15 constituting the sub-active layers.

At this time, since the gate insulating film forming step, which activates and diffuses the sub-doped layers 18 to form the boundary region diffusion layers 15, is effected at a higher temperature than the later annealing in a nitrogen atmosphere using an oxidation-diffusion furnace for forming the high-concentration diffusion layers 11, the arsenic constituting the impurity of the sub-doped layers 18 wraps far into the layer under the bird's beak 3a to form the boundary region diffusion layers 15.

Figure 17:
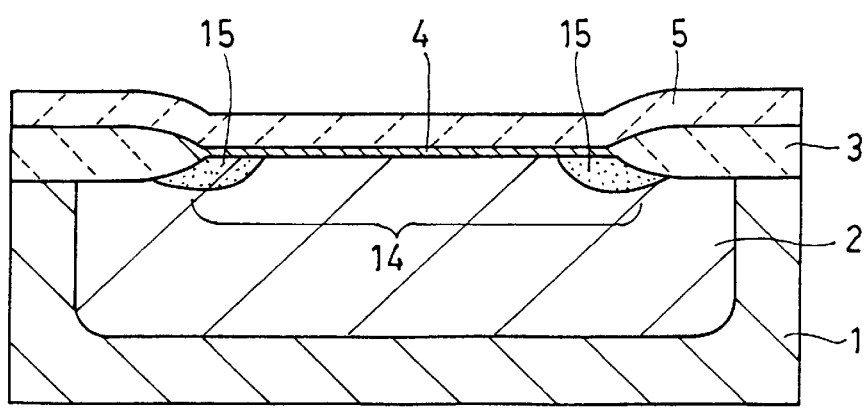

Following this, as shown in FIG. 17, a polycrystalline silicon film 5 is formed to a thickness of 350 nm over the whole surfaces of the field oxide film 3 and the gate insulating film 4 by the CVD process using monosilane ($SiH_4$) as reaction gas.

Figure 18:
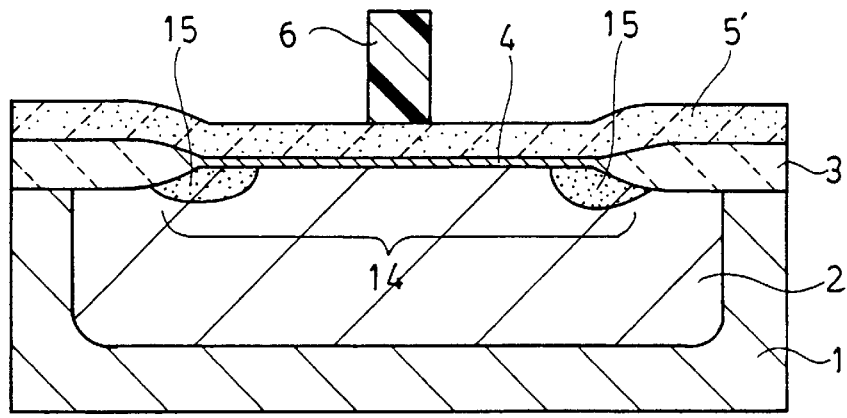

Further, phosphorus, an impurity of N-type conductivity, is added over the whole surface of the polycrystalline silicon film 5 by ion implantation under condition of an ion implantation dose of about $10^{16}$ atoms/cm$^2$, whereby, as shown in FIG. 18, a polycrystalline film 5' added with N-type impurity is formed.

Next, the whole surface of the polycrystalline film 5' is formed with photoresist by spin coating and the photoresist 6 is exposed through a prescribed photomask and developed to pattern it in the shape of a gate.

Figure 19:
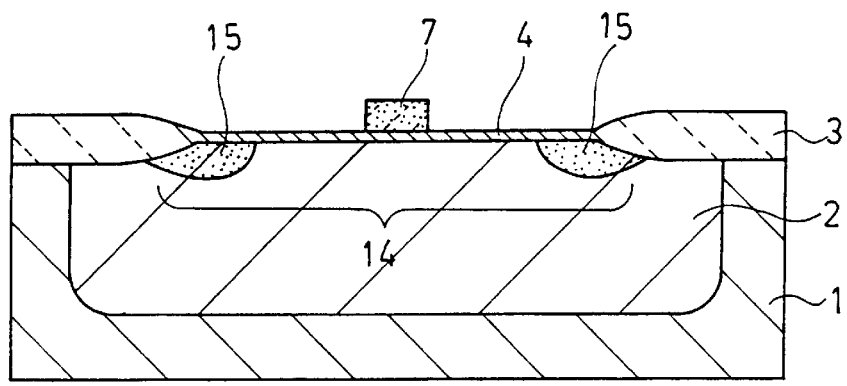

The patterned photoresist 6 is then used as an etching mask to etch the polycrystalline film 5' by anisotropic etching using sulfur hexafluoride ($SF_6$), chlorine ($Cl_2$) and difluoromethane ($CH_2F_2$) as etching gas to pattern it as a gate 7, as shown in FIG. 19.

Following this, the photoresist 6 used as the etching mask is removed from the gate 7.

Figure 20:
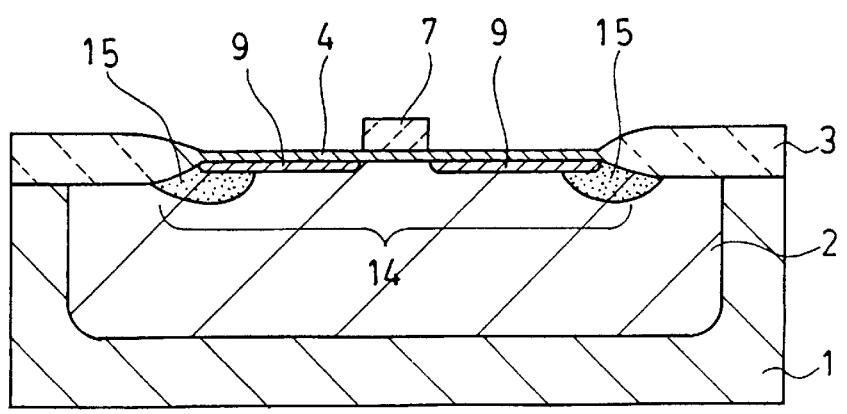

Next, to form the source and drain, the regions of the device region 14 of the P well 2 aligned between the gate 7 and the field oxide film 3 on opposite sides of the gate 7 are added with arsenic, a main impurity of N-type conductivity, by ion implantation under conditions of an ion injection acceleration energy of 60 KeV and an ion implantation dose of about $10^{15}$ atoms /cm$^2$, as shown in FIG. 20, to form main doped layers 9, 9.

Figure 21:
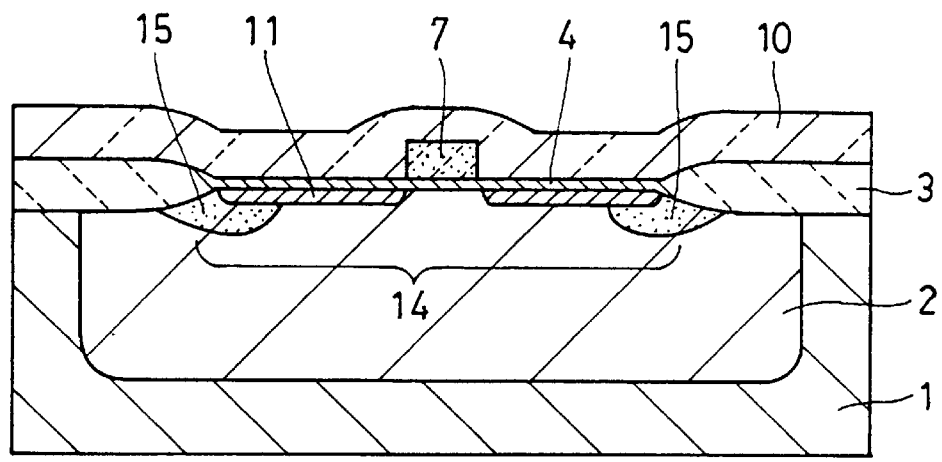

Next, as shown in FIG. 21, the interlevel insulator film 10 consisting of a silicon oxide film containing phosphorus (P) and boron (B) is formed to a thickness of 500 nm over the whole surface by the CVD process using monosilane ($SiH_4$), diborane ($B_2H_6$) and phosphine ($PH_3$) as reaction gas.

Following this, an oxidation-diffusion furnace is used to effect annealing at a temperature of 900° C. in a nitrogen atmosphere, thereby activating the N-type impurity arsenic of the main doped layers 9, 9. As a result, the high-concentration diffusion layers 11, which are the main active layers of N-type conductivity constituting the source and drain of the N-type MOS transistor, are formed.

This annealing at a temperature of 900° C. in a nitrogen atmosphere causes almost no diffusion of the arsenic constituting the impurity ions of the main doped layers 9.

Next, the contact holes 12, 12 shown in FIG. 22 are formed by patterning prescribed locations of the interlevel insulator film 10 by anisotropic etching using difluoromethane ($CH_2F_2$) and trifluoromethane ($CHF_3$) as reaction gas and photoresist (not shown) as an etching mask.

Aluminum alloy is then formed over the whole surface of the interlevel insulator film 10 as an interconnecting material by sputtering. Anisotropic etching is further effected using photoresist (not shown) patterned in the shape of interconnecting electrodes as an etching mask and chlorine ($Cl_2$) and boron trichloride ($BCl_3$) as etching gas to pattern prescribed locations of the aluminum alloy and form the interconnecting electrodes 13, 13. The N-type MOS transistor shown in FIG. 22 is completed as a result.

With this N-type MOS transistor, too, there can be obtained a junction breakdown voltage characteristic between the drain and the well which, like that shown by the graph of FIG. 14, exhibits no dependence on the distance between the edge portion of the device region and the contact holes.

In the second embodiment explained in the foregoing, the silicon nitride film 17, which is an oxidation-resistant film used in selective oxidation, is removed and arsenic for forming the sub-doped layers 18 is thereafter added to the P well 2 by ion implantation using the pad oxide film 16 as a buffer coating, as shown in FIG. 15.

However, it is also possible to remove the pad oxide film 16 from the device region 14, form a white ribbon oxide film thereon for the purpose of removing silicon nitride film 17 residue, and add the arsenic for forming the sub-doped layers 18 to the P well 2 by ion implantation using the white ribbon oxide film as a buffer coating.

By "white ribbon" is meant the silicon nitride film formed in the selective oxidation step shown in FIG. 3 by reaction between the nitrogen component of the silicon nitride film 17 used as an oxidation-resistant film during formation of the field oxide film 3 and the silicon semiconductor substrate 1 during formation of the field oxide film 3.

The white ribbon consisting of a silicon nitride film cannot be etched and removed with the buffered acid solution of a mixed solution of ammonium fluoride ($NH_4F$) and hydrofluoric acid (HF) for removing the pad oxide film 16. The white ribbon can therefore not be removed simultaneously with etching and removal of the pad oxide film 16.

If the gate insulating film 4 is formed while the white ribbon still remains, precise control of the threshold voltage of the MOS transistor becomes difficult because silicon nitride film differing in nature from the gate insulating film 4 mixes into the silicon oxide film of the gate insulating film 4.

To remove this white ribbon, therefore, a white ribbon oxide film is formed. This white ribbon oxide film is a silicon oxide film formed to a thickness of about 20 nm in an oxygen atmosphere using an oxidation-diffusion furnace. The white ribbon oxide film formation conditions are an oxidation temperature of 1000° C. and an oxidation period of 30 minutes.

Since the white ribbon oxide film envelopes the white ribbon as it forms by silicon oxidation, the white ribbon can be removed by removing the white ribbon oxide film.

The frequency of white ribbon occurrence differs greatly with the field oxide film 3 formation conditions. If no occurrence of white ribbon is observed after removal of the pad oxide film 16, it is not particularly necessary to form the white ribbon oxide film.

Moreover, in the aforesaid second embodiment, as shown in FIGS. 15 and 16, after the silicon nitride film 17 is removed, the N-type impurity arsenic for forming the sub-doped layers 18 is added by ion implantation using the pad oxide film 16 as a buffer coating and thermal oxidation is effected at a temperature of 1000° C. to form the gate insulating film 4 on the surface of the device region 14 and simultaneously activate and diffuse the arsenic constituting the impurity of the sub-doped layers 18, thereby forming the boundary region diffusion layers 15,15 constituting the sub-active layers.

In the step of forming the sub-doped layer 18 explained with reference to FIG. 15, however, the addition of the arsenic to the P well 2 need not be effected using the pad oxide film 16 as a buffer coating.

A fabrication method that forms the sub-doped layers 18 without using the pad oxide film 16 as a buffer coating will be explained with reference to the sectional views of FIGS. 23 and 24.

Figure 23:
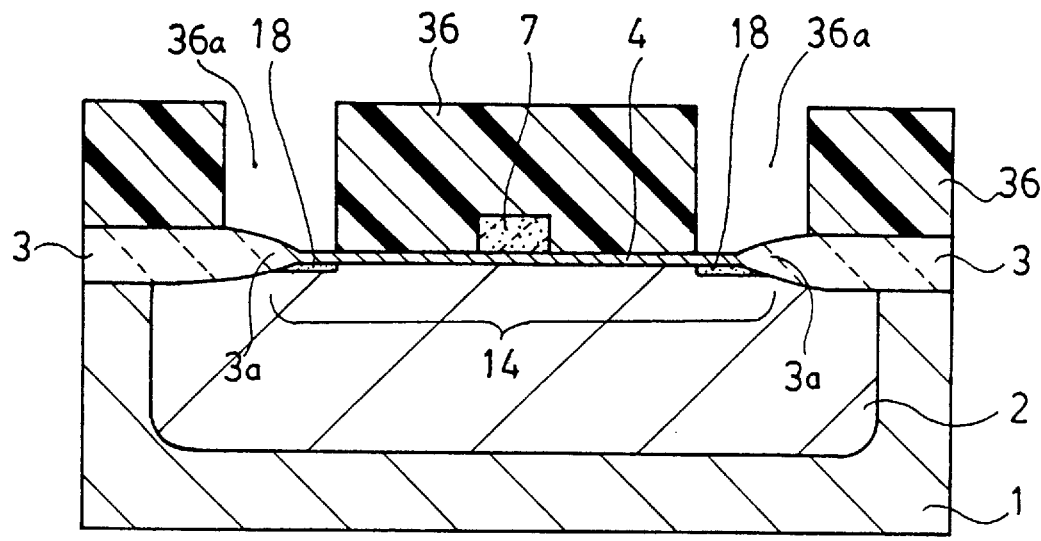
FIGS. 23 and 24 is each a sectional view corresponding to FIG. 15 of the second embodiment showing another embodiment of the method of fabricating a semiconductor device according to the invention.

Specifically, as shown in FIG. 23, after the gate insulating film 4 and the gate 7 have been formed on the device region 14 of the P well 2 of the semiconductor substrate 1, the photoresist 36 is formed over the whole surface by spin coating and the photoresist 36 is exposed through a prescribed photomask and developed to pattern it to form the openings 36a coinciding with regions to be formed with the boundary region diffusion layers.

The patterned shape of the boundary region diffusion layers is the same as the shape of the boundary region diffused layers 15, 15 indicated by hatching in the plan view of FIG. 13, namely, the regions between the field oxide film 3 and device region 14 other than the regions in the vicinity of the gate 7.

Then, to form the sub-doped layers 18 using the photoresist 36 as an ion implantation blocking film, arsenic, an N-type impurity, is added to the regions of the P well 2 at the boundary between the field oxide film 3 and the device region 14 by ion implantation to form the sub-doped layers 18, 18. The photoresist 36 is then removed.

Figure 24:
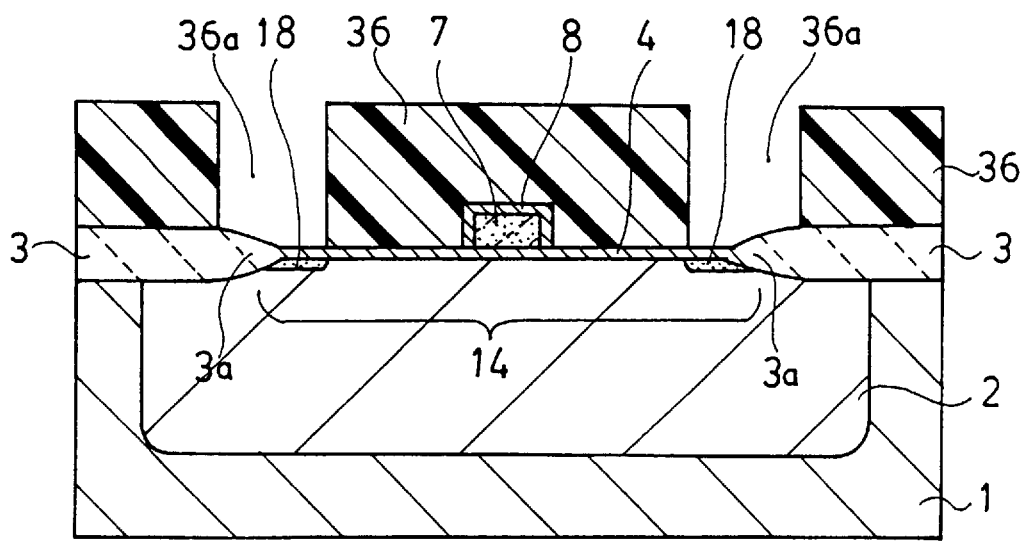
Figure 25:
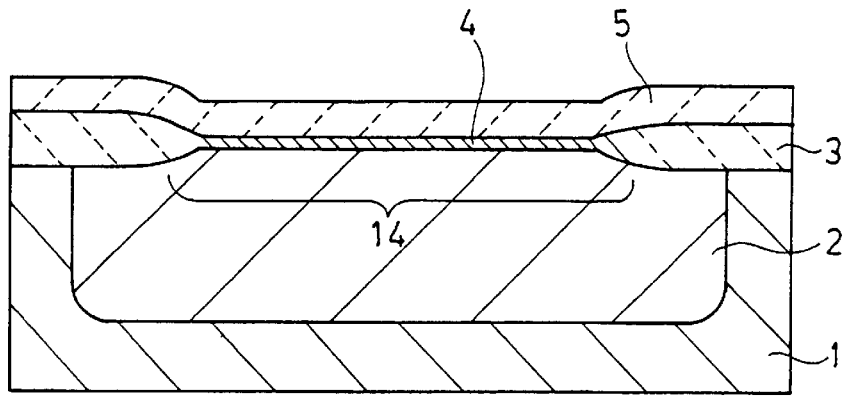
FIGS. 25–30 are sectional views showing the steps after field oxide film formation in a method of fabricating a semiconductor device according to the prior art, with FIG. 30 showing the structure of the completed semiconductor device.
Figure 26:
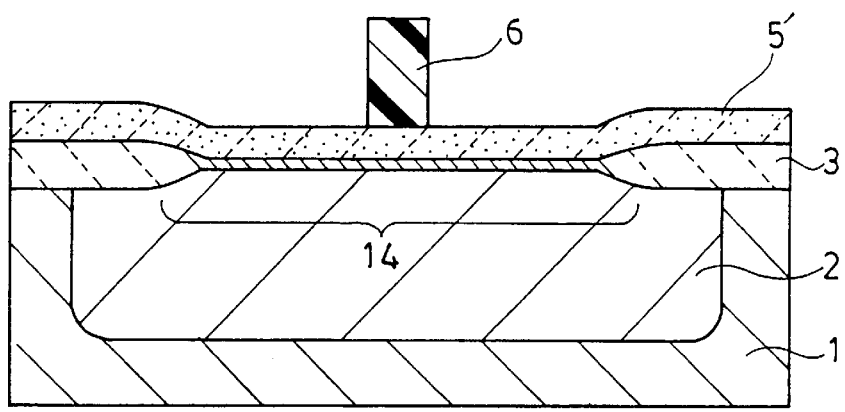
Figure 27:
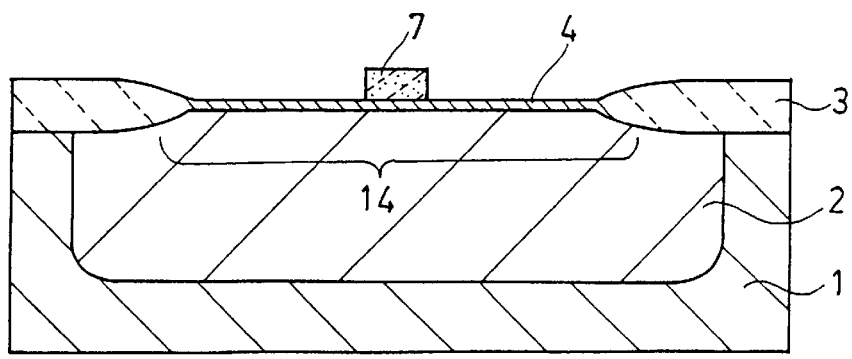
Figure 28:
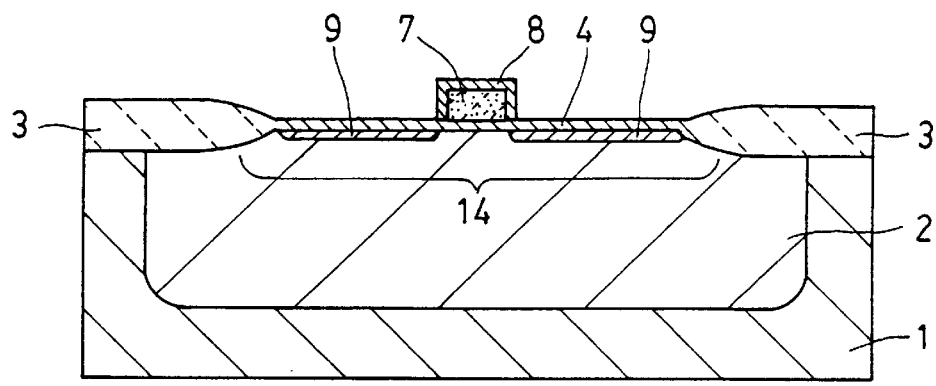
Figure 29:
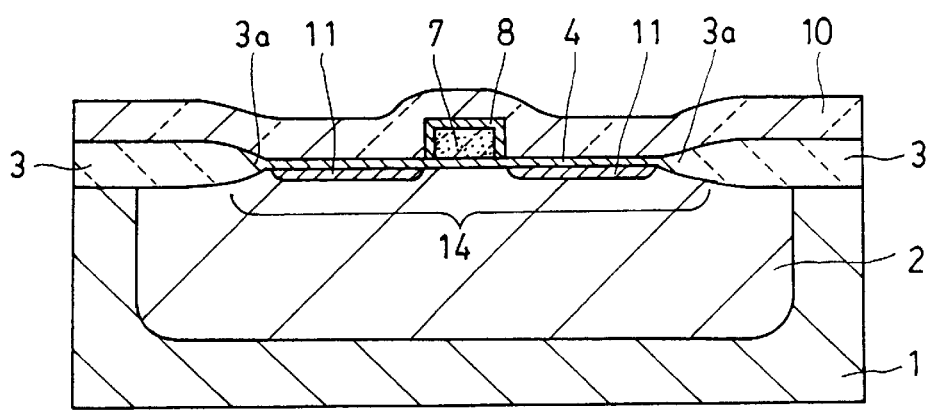

Then, as shown in FIG. 24, the mask oxide film 8 is formed on the surface of the gate 7 to a thickness of 10 nm by using a diffusion furnace to effect annealing in an oxygen atmosphere at a temperature of 1000° C. for 30 minutes and, simultaneously with the forming of this mask oxide film, also activating and diffusing the arsenic of the sub-doped layers 18, 18, thereby forming the boundary region diffusion layers constituting the sub-active layers (not shown).

At this time, since the step of forming the mask oxide film 8, which activates and diffuses the sub-doped layers 18 to form the boundary region diffusion layers 15, is effected at a higher temperature than the later annealing in a nitrogen atmosphere using an oxidation-diffusion furnace for forming the high-concentration diffusion layers 11, the arsenic constituting the impurity of the sub-doped layers 18 wraps far into the layer under the bird's beak 3a to form the boundary region diffusion layers 15.

The N-type MOS transistor fabricated by this method also provides an effect similar to that of the second embodiment.

In the foregoing embodiment, it is also possible to form the sub-doped layers 18, 18 as shown in FIG. 23, remove the photoresist 36, and, before forming the high-concentration diffusion layers constituting the source and drain, annealing the sub-doped layers 18, 18 in an inert atmosphere to activate the arsenic constituting the impurity thereof and thereby form the boundary region diffused layers constituting the sub-active layers.

In this case, the annealing temperature for forming the boundary region diffusion layers (sub-active layers) is made higher than the annealing temperature for forming the high-concentration diffusion layers (main active layers) constituting the source and drain.

As was explained regarding the foregoing embodiments, the semiconductor devices fabricated by the method according to this invention (in the embodiments, N-type MOS transistors) suppress the short-channel effect by forming the source and drain as high-concentration diffusion layers that constitute active layers of shallow depth. However, they are provided at the boundary regions between the device region of the semiconductor substrate and the field oxide film with, as sub-active layers, boundary region diffusion layers into which impurity has been selectively diffused and activated.

Therefore, even if the contact holes are formed out of alignment with the prescribed locations of the device region so that the contact holes overlap the bird's beak of thin oxide film at the peripheral portion of the field oxide film, the interconnecting electrodes formed therein can still be prevented from directly contacting the well or the semiconductor substrate.

There can therefore be obtained an MOS transistor which has as a characteristic that the junction breakdown voltage between the drain and the well exhibits no dependence on the distance between the edge portion of the device region and the contact holes.

Since this enables a junction breakdown voltage of adequate value to be always secured between the drain and the well or between the drain and the semiconductor substrate and suppresses flow of unnecessary current within the semiconductor substrate, normal operation of the MOS transistor can be controlled with high precision at all times.

In the foregoing embodiments, examples were explained in which a P well 2 is formed in the semiconductor substrate 1, and an N-type MOS transistor is formed therein which has high-concentration diffusion layers 11, 11 of N-type conductivity constituting the source and drain, and boundary region diffused layers 15, 15 of N-type conductivity.

However, the N-type MOS transistor having the high-concentration diffusion layers of N-type conductivity constituting the source and drain and the boundary region diffusion layers can also be formed directly on a semiconductor substrate of P-type conductivity.

It is also possible to form an N-type diffusion layer of low impurity concentration (N well) on the semiconductor substrate 1 and form a P-type MOS transistor therein which has high-concentration diffusion layers constituting main active layers of P-type conductivity as the source and drain, and boundary region diffused layers constituting sub-active layers.

Moreover, the P-type MOS transistor having the high-concentration diffusion layers constituting the main active layers of P-type conductivity as the source and drain and the boundary region diffusion layers constituting the sub-active layers can also be formed directly on a semiconductor substrate of N-type conductivity.

These MOS transistors were also found to provide effects similar to those of the earlier embodiments.

What is claimed is:

1. A semiconductor device comprising:
    a device region provided in a semiconductor substrate,
    a field oxide film having a bird's beak at an inner peripheral portion provided on the semiconductor substrate to surround the device region resulting from selective oxidation to the semiconductor substrate, a gate provided in the device region via an intervening gate insulating film, impurity-diffused main active layers provided in regions of the semiconductor substrate between the gate and the field oxide film to constitute a source and a drain, and sub-active layers formed so as to cover an overlap between the bird's beak of the field oxide film and the main-active layer by selectively diffusing impurity into regions of the semiconductor substrate at boundaries between the device region and the field oxide film.

2. A semiconductor device according to claim 1, further comprising a mask oxide film provided on a surface of the gate.

* * * * *